United States Patent [19]

Kobayashi

[11] 4,036,672
[45] July 19, 1977

[54] METHOD OF MAKING A JUNCTION TYPE FIELD EFFECT TRANSISTOR

[75] Inventor: Sadao Kobayashi, Hachioji, Japan

[73] Assignee: Hitachi, Ltd., Japan

[21] Appl. No.: 683,265

[22] Filed: May 5, 1976

[30] Foreign Application Priority Data

May 14, 1975 Japan .................. 50-56109

[51] Int. Cl.² ................ H01L 21/74; H01L 29/80
[52] U.S. Cl. ..................... 148/175; 29/571;
148/174; 357/22; 357/59
[58] Field of Search .......... 148/174, 175, 187;
156/612; 29/571; 357/22, 59

[56] References Cited

U.S. PATENT DOCUMENTS

| 3,497,777 | 2/1970 | Teszner | 357/22 |
| 3,617,826 | 11/1971 | Kobayashi | 357/22 X |
| 3,619,737 | 11/1971 | Chiu | 357/22 |
| 3,648,128 | 3/1972 | Kobayashi | 148/175 X |
| 3,653,120 | 4/1972 | Sirrine et al. | 148/174 X |
| 3,681,668 | 8/1972 | Kubayashi | 357/22 |
| 3,725,751 | 4/1973 | Wakamiya | 148/175 X |
| 3,814,995 | 6/1974 | Teszner | 357/22 |
| 3,977,017 | 8/1976 | Ishitani | 357/22 |

Primary Examiner—L. Dewayne Rutledge
Assistant Examiner—W. G. Saba
Attorney, Agent, or Firm—Craig & Antonelli

[57] ABSTRACT

In the manufacture of a vertical structure junction type field effect transistor, the formation of a gate region is followed by an oxidation treatment of the upper surface of the gate region and then by the growth of a semiconductor layer consisting of a monocrystalline region on the channel portion and a polycrystalline region on the oxide film formed on the gate region. The existence of the oxide film on the gate region prevents the out-diffusion of the impurity doped in the gate region, preventing the lowering of the breakdown voltage, and enabling a short channel length and small series resistance of the channel.

3 Claims, 11 Drawing Figures

FIG. IA PRIOR ART
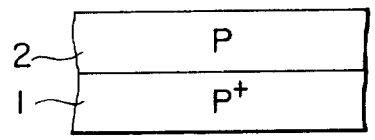
FIG. IB PRIOR ART
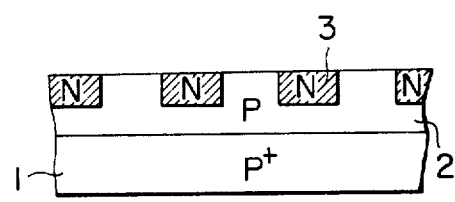
FIG. IC PRIOR ART
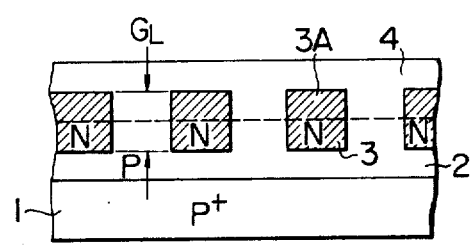
FIG. ID. PRIOR ART
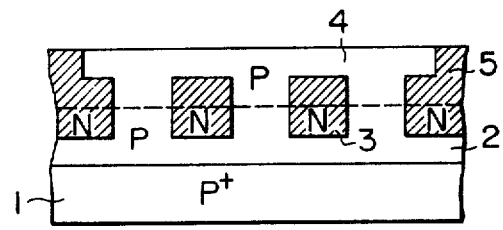
FIG. IE PRIOR ART
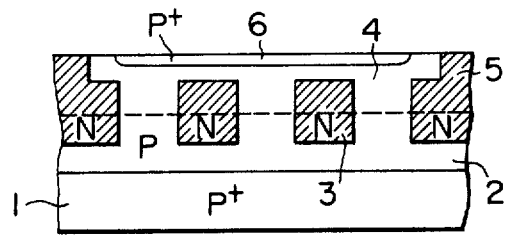

METHOD OF MAKING A JUNCTION TYPE FIELD EFFECT TRANSISTOR

BACKGROUND OF THE INVENTION

1. Field of the Invention

This invention relates to a junction-type field effect transistor and more particularly to a method of manufacturing a junction type field effect transistor having vertical structure.

2. Description of the Prior Art

Vertical structure junction type field effect transistors (referred to as VSJFET hereinbelow) are suited for the purpose of obtaining a large drain current, i.e. for high output power use, compared to the lateral structure FET's. This is because the gate region in a VSJFET can be formed in geometrically divided multiple regions which enables a large current flow in total. Such a VSJFET is, for example, shown in Japanese Pat. Publication No. 41478/1972. FIGS. 1A to 1E show the conventional steps of manufacturing a VSJFET which will be described hereinbelow.

On a p+-type silicon substrate 1, a p-type silicon layer 2 is grown by the epitaxial growth method (FIG. 1A). An n-type impurity is selectively diffused into the p-type silicon layer 2 to form a multiplicity of n-type gate regions 3 leaving the p-type channel regions (FIG. 1B). Then, a p-type silicon layer 4 is epitaxially grown on the p-type silicon layer 2 including the n-type gate regions 3 (FIG. 1C). An n-type impurity is doped into desired portions of the p-type layer 4 to form gate extension regions 5 registered with desired portions of the gate regions 3 for forming a gate electrode (FIG. 1D). A p-type impurity is diffused in a desired portion of the p-type silicon layer 4 to form a p+-type source region 6 (FIG. 1E).

According to the above process, however, in the step of FIG. 1C the n-type impurity doped preliminarily in the n-type region 3 causes out-diffusion into the p-type layer 4 and forms an extended layer 2A, resulting in reduction of the breakdown voltage between the gate region and the source region. Further, due to this out-diffusion phenomenon, the gate length $G_l$ of the JFET increases (FIG. 1C) resulting in increase of the series resistance $R_S$ of the channel region and hence increase of power loss

SUMMARY OF THE INVENTION

The present invention aims to solve the above problem. An object of this invention is to provide a method of manufacturing a junction type field effect transistor which prevents the lowering of the breakdown voltage between the gate region and the source region.

Another object of this invention is to provide a method of manufacturing a junction type field effect transistor which enables a small series resistance of the channel region.

The above and other objects, features and advantages of this invention will become apparent from the detailed description of the embodiment of this invention when taken in conjunction with the accompanying drawings.

BRIEF DESCRIPTION OF THE DRAWINGS

FIGS. 1A to 1E are cross-sectional diagrams showing the conventional steps of manufacturing a JFET.

DESCRIPTION OF THE PREFERRED EMBODIMENT

An embodiment of this invention will be described hereinbelow referring to FIGS. 2A to 2F.

Figure 2A:
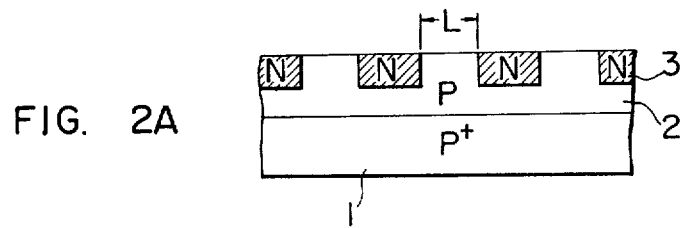
FIGS. 2A to 2F are cross-sectional diagrams showing the respective steps of an embodiment of the method of manufacturing a JFET according to this invention.

A substrate comprises a p+-type silicon substrate 1 having an impurity concentration of about $10^{19}$ to $10^{20}$ atoms/cm$^3$ and a p-type silicon layer 2 having a thickness of 10 to 15 microns and an impurity concentration of 2 to 5 $\times$ 10$^{14}$ atoms /cm$^3$ and epitaxially deposited on the p+-type silicon substrate 1. Such a substrate is subjected to a heat treatment in an atmosphere containing phosphorus to form an n-type gate region 3 having a depth of about 4 to 5 microns and a surface impurity concentration of about $10^{17}$ to $10^{18}$ atoms/cm$^3$. This gate region 3 is seen to be divided into multiple regions in the cross-section but is electrically connected. The gate region 3 is designed to have a width of 10 to 12 microns and a separation L between adjacent regions L of 3 to 5 microns (FIG. 2A).

Figure 2B:
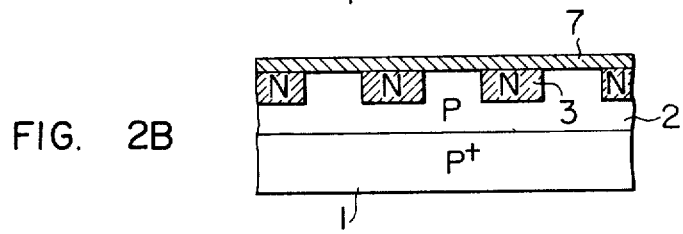

The substrate 1 is treated in an atmosphere containing oxygen at 1100° C for 30 minutes to form an oxide layer 7 of a thickness of about 0.2 to 0.3 micron (FIG. 2B).

Figure 2C:
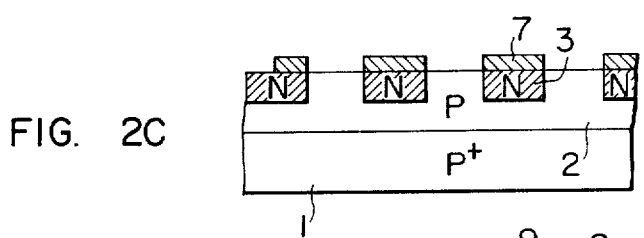

The oxide film 7 is subjected to a selective photoetching treatment to leave only the portions on the gate region 3. Here, hydrofluoric acid is used as the etchant and the assembly is immersed in the hydrofluoric acid for 2 to 3 minutes (FIG. 2C).

Figure 2D:
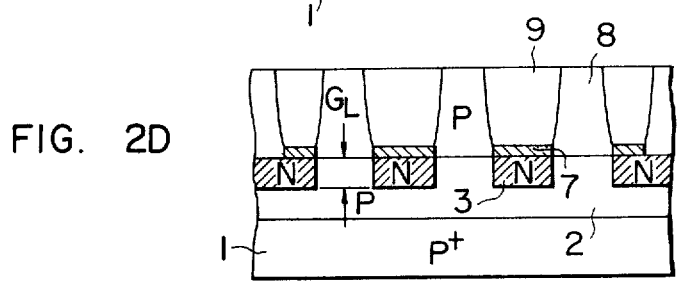

The substrate is subjected to a streaming atmosphere if silicon tetrachloride SiCl$_4$, hydrogen chloride HCl and hydrogen H$_2$ about 1150° C for 60 minutes to epitaxially deposit a p-type silicon layer 8 of a thickness of about 4 to 5 microns having an impurity concentration of about 5 $\times$ 10$^{15}$ atoms/cm$^3$. Here, the portion of the layer 9 deposited on the oxide film 7 inevitable becomes polycrystalline (FIG. 2D).

Figure 2E:
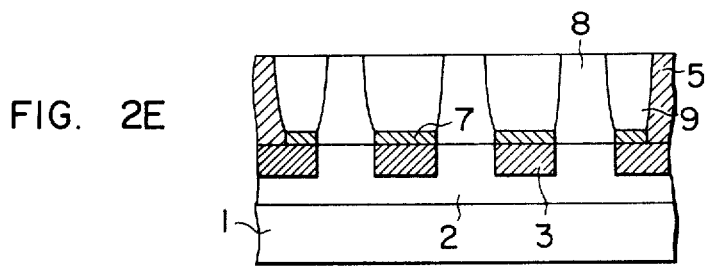

The substrate is treated in an atmosphere containing phosphorus at about 1050° C for about 10 hours to selectively form an extension region 5 of the gate region 3 having an impurity concentration of about $10^{19}$ to $10^{20}$ atoms/cm$^3$. This region 5 is formed for enhancing the electric connection between the gate region 3 and a gate electrode. Here, the substrate surface not requiring this treatment is masked by an oxide film not shown (FIG. 2E).

A p-type impurity is diffused into a desired portion of the surface of the silicon layer 8 and 9 to form a p+-type source region 6. This diffusion may be done by treating the substrate in an atmosphere containing boron at 950° C for 30 minutes, which produces a p+-type region 6 of a depth of about 0.5 micron having a surface impurity concentration of about $10^{19}$ to $10^{20}$ atoms/cm$^3$. Here, boron impurity doped in the polycrystalline region 9 penetrates much faster than that in the region 8 and form a p+-type region of a depth of about 1 micron, resulting in a step-like source region 6.

Figure 2F:
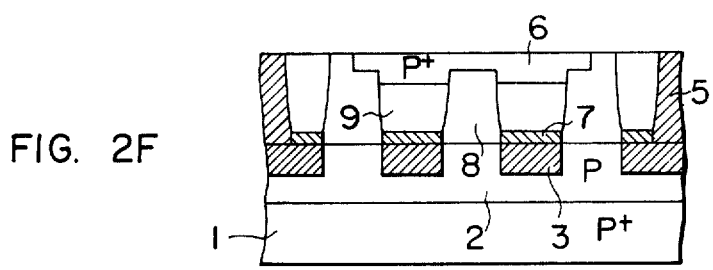

Then, electrode material such as aluminium is deposited on the regions 5 and 6 for form a gate and a source electrode (not shown). On the other hand, Au-Si eutectic alloy or solder is deposited to the other surface of the substrate to form a drain electrode (FIG. 2F).

As is described hereinabove, according to this invention an epitaxial growth for forming a source region is carried out after an insulating film is formed selectively on the gate region. Therefore, out-diffusion of the impurity doped in the gate region into the epitaxial layer can be prevented. As a result, the lowering of the breakdown voltage between the source and the gate is prevented. Further, since there occurs no increase in the gate length, the increase in the series resistance of the channel region is also prevented.

In an example, the breakdown voltage which had been 60 to 70 volts was improved to 90 to 100 volts. Further, the series resistance which had been 4 to 6 ohms reduced to 2 to 3 ohms.

The insulating film for masking the gate region is not limited to silicon oxide and other materials such as $Si_3N_4$, $Al_2O_3$, $P_2O_5$ can be used. It should be noted that the insulating film may be a film which exhibits the property of preventing the migration of ions of impurity of the gate region. In the above embodiment, the silicon layer deposited on the insulating layer becomes polycrystalline, but no harmful effect is found in operation if a source region is formed in this polycrystalline region.

The above embodiment used a p-type substrate as the starting material, but an n-type substrate can be equally used apparently. When an n-type substrate is used, the conductivity type of the gate and the source regions should naturally be altered to the opposite type, i.e., p-type and n-type respectively.

The selective formation of a gate and a source region is not limited to the diffusion method, but the ion implantation method or the combination of the two may be adopted.

What is claimed is:

1. A method of manufacturing a junction type field effect transistor comprising the steps of:
    selectively forming, in a semiconductor substrate of a first conductivity type serving as a drain region, a gate region of a second conductivity type except the portion which serves as a channel region;
    masking the surface of said gate region with an insulating film;
    depositing a semiconductor layer of said first conductivity type on the surfaces of said insulating film and said semiconductor substrate; and
    forming a source region of said first conductivity type in a predetermined portion of said semiconductor layer.

2. A method of manufacturing a vertical structure junction type field effect transistor comprising the steps of:
    forming, in a semiconductor substrate of a first conductivity type forming a drain region, a gate region of a second conductivity type except the portion forming a channel portion;
    forming a film masking the upper surface of said gate region, said film exhibiting the property of preventing the migration of impurity ions of the second conductivity type;
    epitaxially growing a channel region of the first conductivity type on the upper side of said channel portion and simultaneously a polycrystalline silicon layer on said film; and
    forming a source region in at least said epitaxial layer.

3. A method according to claim 2, in which said film is an oxide film.

* * * * *